US006757872B2

United States Patent
Pistilli et al.

(10) Patent No.: US 6,757,872 B2
(45) Date of Patent: Jun. 29, 2004

(54) COMMAND USER INTERFACE WITH PROGRAMMABLE DECODER

(75) Inventors: Pasquale Pistilli, Cappelle dei Marsi (IT); Elio D'Ambrosio, Avezzano (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/050,475

(22) Filed: Jan. 15, 2002

(65) Prior Publication Data

US 2002/0186049 A1 Dec. 12, 2002

(30) Foreign Application Priority Data

May 31, 2001 (IT) ..................................... RM2001A0298

(51) Int. Cl.[7] .............................................. G06F 17/50
(52) U.S. Cl. ............................... 716/1; 716/17; 716/21; 716/16; 326/101
(58) Field of Search ............................... 716/2, 16, 19; 365/189.05; 714/773; 355/71; 326/41, 39, 107

(56) References Cited

U.S. PATENT DOCUMENTS

| 4,633,429 | A | * | 12/1986 | Lewandowski et al. .............. 365/189.05 |
| 4,930,112 | A | * | 5/1990 | Tanaka et al. .............. 365/226 |
| 5,541,938 | A | * | 7/1996 | Di Zenzo et al. ........... 714/773 |
| 5,588,137 | A | * | 12/1996 | Yoneda et al. .............. 711/163 |
| 5,943,488 | A |  | 8/1999 | Raza |
| 6,084,656 | A |  | 7/2000 | Choi et al. |
| 6,292,018 | B1 | * | 9/2001 | Kean ........................... 326/41 |
| 6,496,971 | B1 | * | 12/2002 | Lesea et al. ................. 716/16 |
| 6,501,702 | B2 | * | 12/2002 | Takagiwa et al. ....... 365/230.06 |
| 2001/0028574 | A1 | * | 10/2001 | Ymchengl .................. 365/104 |

* cited by examiner

Primary Examiner—Vuthe Siek
Assistant Examiner—Helen Rossoshek
(74) Attorney, Agent, or Firm—Leffert Jay & Polglaze P.A.

(57) ABSTRACT

A command user interface with via mask programmability includes a decoder with transistors selectively coupleable to one of an input or its complement. This is accomplished in one way by making vias in an appropriate location to allow interconnection of the appropriate contact and the gate of the transistor.

20 Claims, 5 Drawing Sheets

COMMAND USER INTERFACE WITH PROGRAMMABLE DECODER

This application claims priority to Italian Application SN RM2001A000298 filed May 31, 2001.

The present invention relates generally to ROM operation, and more specifically to a programmable via mask for ROM encoding.

BACKGROUND

Decoders are used in read only memories to decode input data for presentation to the ROM to allow the ROM to execute an operation programmed into the ROM if the proper input sequence of data is presented.

There are several problems with making a decoders. In some decoders, a microcontroller gives a sequence or coding to enter a specific operation which is encoded into a read only memory (ROM) and the enabling circuitry for the ROM. Such specific operations include by way of example read array, read configuration register, program, erase, suspend, and the like.

A command user interface (CUI) is a state machine that recognizes multi-cycle microprocessor commands. The commands are entered using multi-clock cycle operations. For each cycle, the CUI changes state depending upon the current inputs and the decoding of the previous state of the system. A typical CUI implementation is one which is based in logic gate network syntheses starting from circuit equations and automated layout generation. While this method provides fast solutions for layout generation, it is very inflexible. If even one command equation changes, the entire circuit layout and subsequent generation flow must also be re-executed. This results in significant delays in production. When delays in production occur, money is lost.

Common state machines used for decoding include Mealy and Moore Model state machines.

SUMMARY

In one embodiment, a command user interface includes a decoder having a series of transistors whose gates are selectively coupled to receive either an input or its complement using vias, a read only memory, and a number of latches to latch input and output data for the command user interface.

In another embodiment, a programmable decoder includes a first decoder section having a number of transistors connected in series. The gates of the transistors are selectively coupled to receive either an input or its complement from one of a pair of contacts. Each contact is coupled to the input or to the complement of the input.

In another embodiment, a method of changing a command definition of a decoder includes changing only via locations in an insulating layer, wherein a via location defines a contact to which a gate of a transistor is coupled.

In yet another embodiment, a method of programming a decoder includes fabricating a number of series connected transistors, and fabricating a pair of contacts for each transistor. Each contact is hard wired to either an input or a complement of the input, and the gate of each transistor is selectively coupled to one of its pair of contacts.

Other embodiments are described and claimed.

DETAILED DESCRIPTION

In the following detailed description of the embodiments, reference is made to the accompanying drawings which form a part hereof, and in which is shown by way of illustration specific embodiments in which the invention may be practiced. It is to be understood that other embodiments may be utilized and structural or logical changes may be made without departing from the scope of the present invention.

Figure 1:
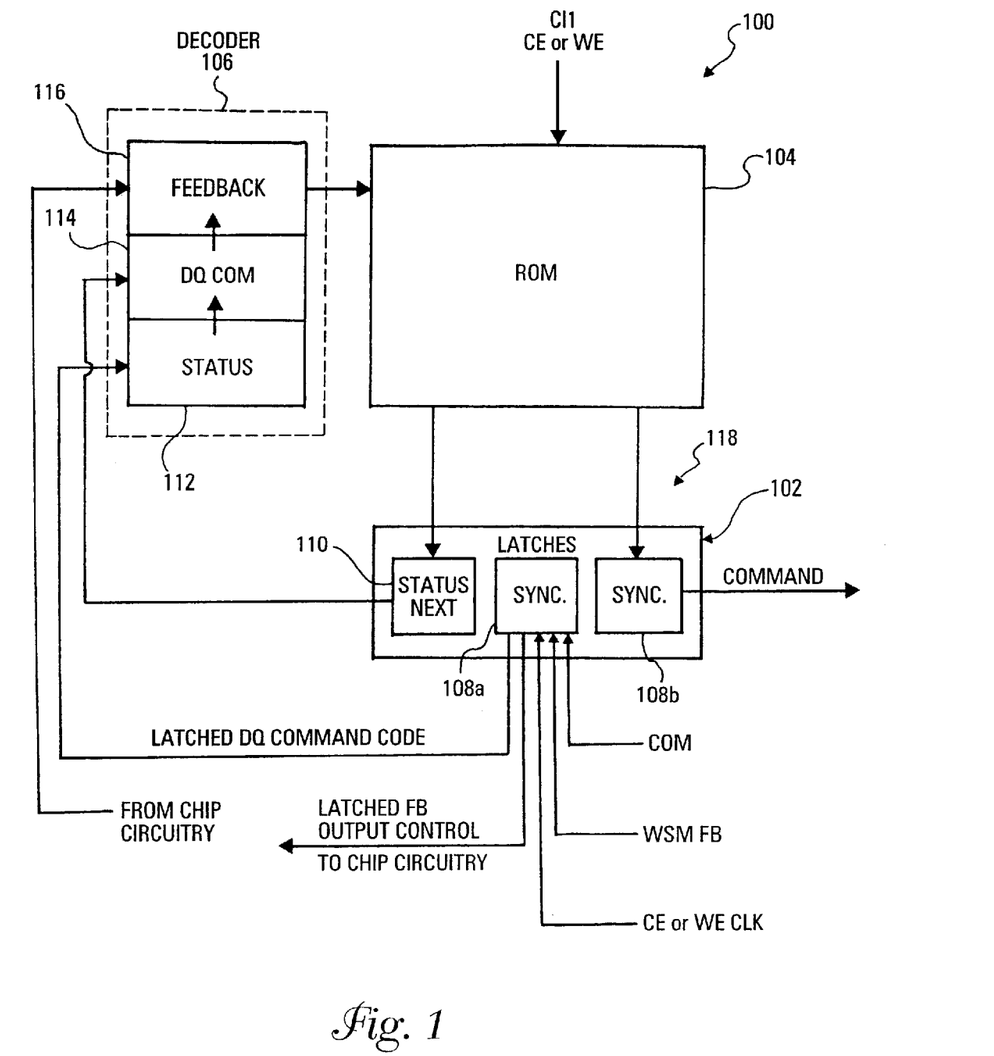
FIG. 1 is a block diagram of an embodiment of the present invention.

FIG. 1 is a block diagram of a command user interface (CUI) 100 according to one embodiment of the present invention. CUI 100 comprises in one embodiment a series of latches 102, a read only memory (ROM) 104, and a decoder 106. The latches 102 comprise in one embodiment synch latches 108 and status latches 110. The decoder 106 in one embodiment comprises three sections, a status section 112, a DQ command section 114, and a feedback section 116. The input synch latches 108a receive incoming signals comprising clock signals, incoming data inputs, and feedback from a write state machine (WSM). The input synch latches 108a output outgoing signals including a latched DQ command code and latched feedback output control, to the decoder 106 and external chip circuitry, respectively. Output synch latches 108b receive output from ROM 104, and output commands externally. Status latch 110 receives status information from ROM 104 and latches it to decoder 106.

The inputs to the CUI 100 in one embodiment are a clock signal CLK to synchronize operation, and a command code COM. The clock signal serves to synchronize operation of the system 100. In one embodiment, the clock signal is a combination of a write enable WE* (active low) signal and a chip enable CE*(active low) signal. The command code COM is in one embodiment an 8 bit command code issued by a user and is input to the system 100 through DQ pins (not shown). In the system 100, the user's commands indicate a desired operation to be performed by a ROM such as ROM 104. A specific operation is programmed or encoded into the ROM 104 through encoding which is described in further detail later.

If the operation programmed into the ROM 104 and the operation indicated by the user supplied data are the same, the operation is performed by the ROM 104. If the desired operation and the programmed operation differ, then there is an error situation.

The CUI 100 is a state machine that recognizes multi-cycle microprocessor commands. The command user interface in one embodiment interprets the commands sent into the system, usually by a user. The commands are entered using multi-clock cycle operations. For each cycle, the CUI changes state depending upon the current inputs and the decoding of the previous state of the system. For each state, the CUI generates the proper outputs which are sent to a write state machine (WSM), thus delegating the WSM to take over control of the execution of the current algorithm.

A decoder in one embodiment of the present invention is arranged in three sections, a status section, a DQ command section, and a feedback decoder section. Data sent in to the CUI from outside into the ROM is fed to the synchronizing latches to synch with the system clocks.

The decoding is performed with a decoder such as decoder 106 to decode data input to the ROM, with latches such as latches 108 and 110 to store various data and other information from the ROM, and with control circuitry for implementing timing for the system. The decoder such as decoder 106 accepts as inputs in one embodiment a command code from the synch latches 108, a series of feedback signals from external to the decoder chip circuitry, and a status code from the status latches. In one embodiment, the command code is an 8 bit command code. In one embodiment, the series of feedback signals are sent from several circuitries of the CUI, including in various embodiments charge pumps, WSMs, analog blocks, and the like. The feedback signals provide the CUI information about the status of the circuitry controlled by the CUI. In one embodiment, the status code is an 8 bit status code.

The inputs are in one embodiment parallel decoded by a decoder such as decoder 106. The input data is fed to the decoder through latches such as synch latches 108. In one embodiment, the decoder decodes the inputs based on the current status of the ROM, feedback signals from external chip circuitry, and the current inputs. When the inputs are decoded, they are presented to the ROM 104. If what is encoded into the ROM 104 matches the decoded inputs, then the specific operation written in the ROM 104 is performed. If what is encoded into the ROM 104 does not match the decoded inputs, then an error situation exists.

In order for the ROM decoder 106 to function, the ROM must first be encoded. Each of the signals sent to the decoder is in one embodiment decoded in its own separate section of the decoder. Each decoder section in one embodiment comprises a series of blocks of transistors which decode individual bits of data. Such blocks are described in further detail below. In one embodiment, the blocks are each programmable so as to allow for easy programming and therefore encoding. In one embodiment, each byte of a command series is decoded using a section of the decoder 106.

Figure 2:
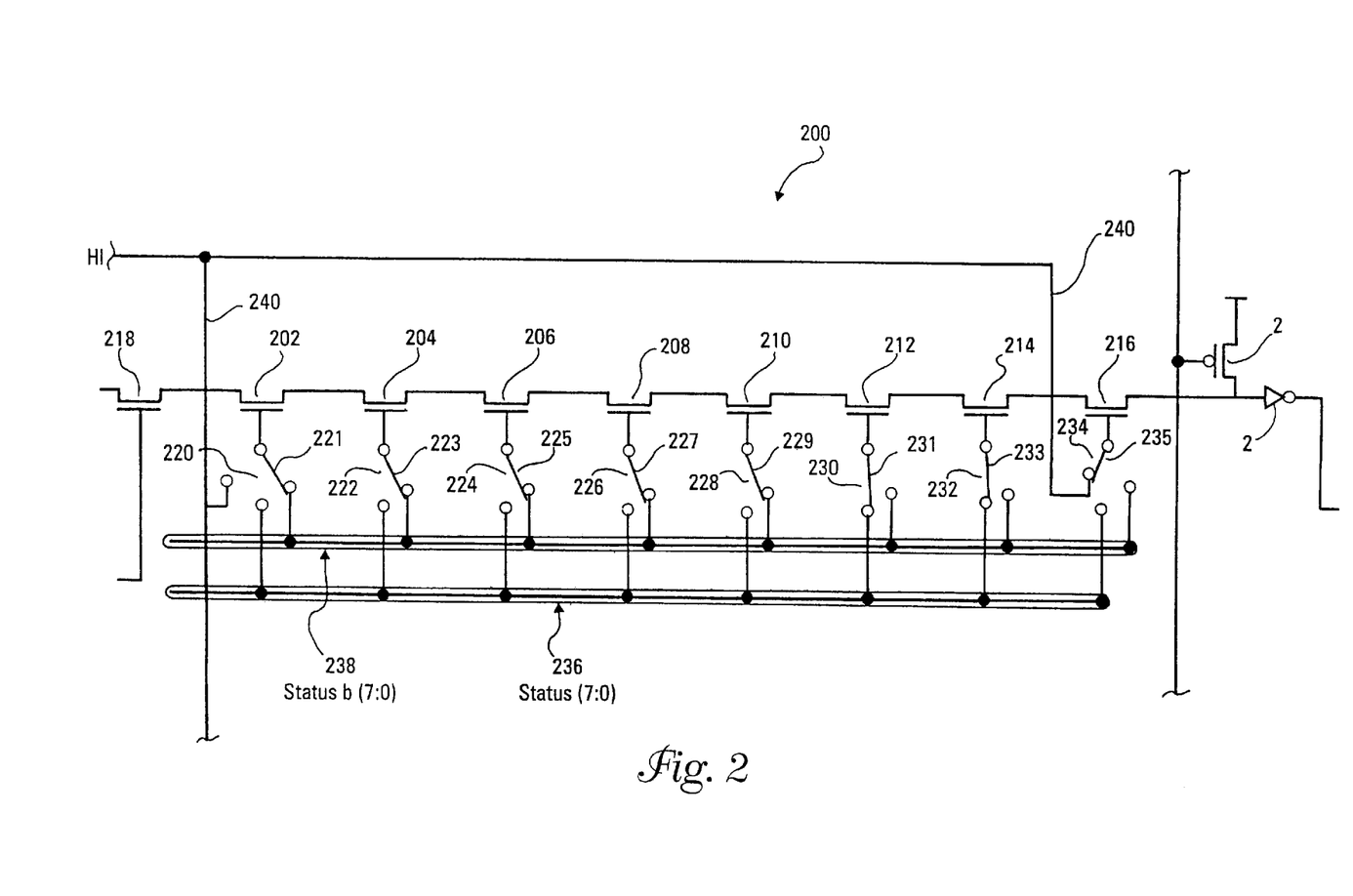
FIG. 2 is a circuit diagram of a portion of another embodiment of the present invention.

A portion of the decoder 106 is shown in greater detail in FIG. 2. Decoder 106 comprises in one embodiment a series of blocks such as block 200. Each of the blocks decodes one of the input signal combinations. Each block comprises in one embodiment a series connection of eight transistors, configured to recognize a specific single 8 bit input configuration.

Block 200 comprises a series connection of eight transistors 202, 204, 206, 208, 210, 212, 214, and 216. The series of transistors is in one embodiment a series of N type transistors. The series of transistors is enabled by transistor 218 having its gate connected to a ROM_READ signal. Each of the transistors 202, 204, 206, 208, 210, 212, 214, and 216 has its gate selectively connected using interconnects 221, 223, 225, 227, 229, 231, 233, and 235, to one of a pair or more of vias accessing contacts 220, 222, 224, 226, 228, 230, 232, and 234 respectively. The contacts are coupled to a bus 236 carrying all the status inputs to the system (status), or to a bus 238 carrying all of the complements of the status inputs of the system (statusb).

Further, in another embodiment, the contacts 220 and 234 are also coupled directly to a supply voltage for the system via connection lines 240. This connection configures the 202 and 216 transistor locations as "don't cares," meaning that either a binary high or a binary low is acceptable for the configuration. The outcome from the decoder for either state is therefore the same.

Each transistor in one embodiment is capable of being programmed to connect the gate either to a logic 1 or a logic 0 through its respective via and contact. This connection is made in one embodiment through via programming techniques to one input or the inverted value of the input, such that a transistor/contact combination can in various configurations recognize either the 0 or the 1 logic value of the input bit. In another embodiment, two of the eight transistors are programmable as a "don't care." This is accomplished in one embodiment by connecting the gate of the transistor to the power supply for the decoder. A "don't care" (X) bit is used to reduce the number of necessary blocks of series transistors in a decoder such as decoder 106.

As shown in FIG. 2, transistor/contact combinations 202/220, 204/222, 206/224, 208/226, and 210/228 are programmed to activate if their respective input bit on the bus 238 is a binary 0. Transistor/contact combinations 212/230 and 214/232 are programmed to activate if their respective input bit on the bus 236 is a binary 1, and transistor/contact combination 216/234 is programmed as an X or "don't care" bit.

With 8 status bits of information as in one of the embodiments of the present invention, and with 8 input bits of information, there are $2^8$ possible combinations of each set of bits that can be used with the decoder. In order to decode that many combinations, both normal and inverted status signals are used.

If the ROM is changed, selection of the same row, which is one ROM line, can be made with different inputs, depending upon the status bits. For example, if the DQ vias change, the same ROM operation is being performed, but with different user DQ data as input bits. If the ROM changes without changing the decoder, the same inputs on the DQ line will execute a different operation on the ROM. So, the ROM data are an operation desired to be performed, and the decoder data identify which input must be present in order to perform exactly the desired operation.

User data from an external source is presented through the DQ inputs to the decoder via the synch latches. All data sent to decoder is compared to what is written or programmed into the programmable decoder. One of the total number of word lines in the ROM is decoded to obtain data stored in the ROM. This data, retrieved from the ROM if the inputs match what is encoded into the decoder, is used in various embodiments to initiate or perform commands to other circuitry that must perform the outcome that the user is requesting with the input DQ bits. Some part of the data is used to analyze data with new inputs that will arrive at the decoder on the next clock cycle.

A state machine, such as a Mealy or Moore Model state machine, reacts depending upon the state it is in. The state machine moves from state to state, depending in one embodiment upon the inputs, the actual state, and other feedback from other system circuitry such as flash memory, DRAM, and the like. Feedback is defined in one embodiment as certain conditional information. In one embodiment, if an input is A, the resulting state for that input is B. Other conditions like C exist which can change the state. For example, a condition such as C may indicate in one state for a given input, that the operation cannot be performed, and instead a different operation is to be performed.

The previous state, new inputs, and feedback all determine the next state of the state machine. The current state is analyzed with new inputs to determine the next operations for the system to perform. Identical data input into different existing states therefore produces potentially different results based on the current state of the ROM. The specification sheets for ROMs contain tables of information describing all possible sequences and outcomes for various states.

In another embodiment, the transistor banks such as bank or block 200 are programmable. Each of the contacts is accessible through vias in an insulating layer. To complete a contact connection, vias are made in the insulating layer to allow the interconnection of the contact at the appropriate via location to the gate of its transistor. If the particular transistor/contact is to be programmed to activate if its respective input bit is a binary 0, then the appropriate via is drilled in a location to reach the contact hard wired to the statusb line 238. If on the other had the particular transistor/contact is to be programmed to activate when its respective input bit is a binary 1, an appropriate via is drilled in a location to reach the contact hard wired to the status line 236.

In certain instances, one or more of the bits in a particular byte will not affect the programming. For example, in a certain block, such as block 200, the status as a binary 1 or a binary 0 of transistor 202 may not matter. That is, all of the programming for that particular block will rely on some or all of the remaining transistors, but not on transistor 202. In this instance, multiple possible programming may be made on a single block, and the overall number of blocks may be reduced. In this instance, the transistor 202 is programmed as a "don't care" (X). If a 1 or a 0 is asserted as an input on a "don't care" line, the line gives whatever result is necessary, that is it is hard wired to give the proper response.

One instance of the use of a "don't care" bit is when two states are different for only one bit. In that configuration, there is no need to use two rows as would normally be required, one for a binary 1 result and the second for a binary 0 result. Instead, a single "don't care" is used. Forcing a don't care line to the bit that doesn't matter allows the use of one row of the decoder as opposed to two rows of the decoder. Since decoder line space and real estate is at a premium, this is a space saver.

The "don't care" positions are chosen in one embodiment in first and/or last positions for layout efficiency and compactness. While transistors 202 and 216 are the only transistors shown in FIG. 3 to be programmable as "don't care" bits, any of the transistors in the series could be configured in another embodiment to be programmable as a "don't care."

In fabrication of ROMs and the like, the via connections described above are formed in one of the last masks used. Because of this, the embodiments of the present invention allow changes to the masks and therefore to the ROM encoding to be made very late in the fabrication process. In certain embodiments, all the circuit logic and ROM is completely fabricated before the vias must be drilled. Previously, if the programming of a circuit changed at any time after the fabrication process had begun, the entire circuit layout and subsequent generation flow would also need to be re-executed. This resulted in significant delays in production, lost yield, and added expense of fabrication and manufacture. With the programmable via mask and via location embodiments described herein, if the commands or ROM encoding change, the via mask can be redesigned without re-doing the entire process. This saves time and money in the fabrication process. All that changes is the via mask and hence the locations of the vias to be drilled.

Figure 2A:
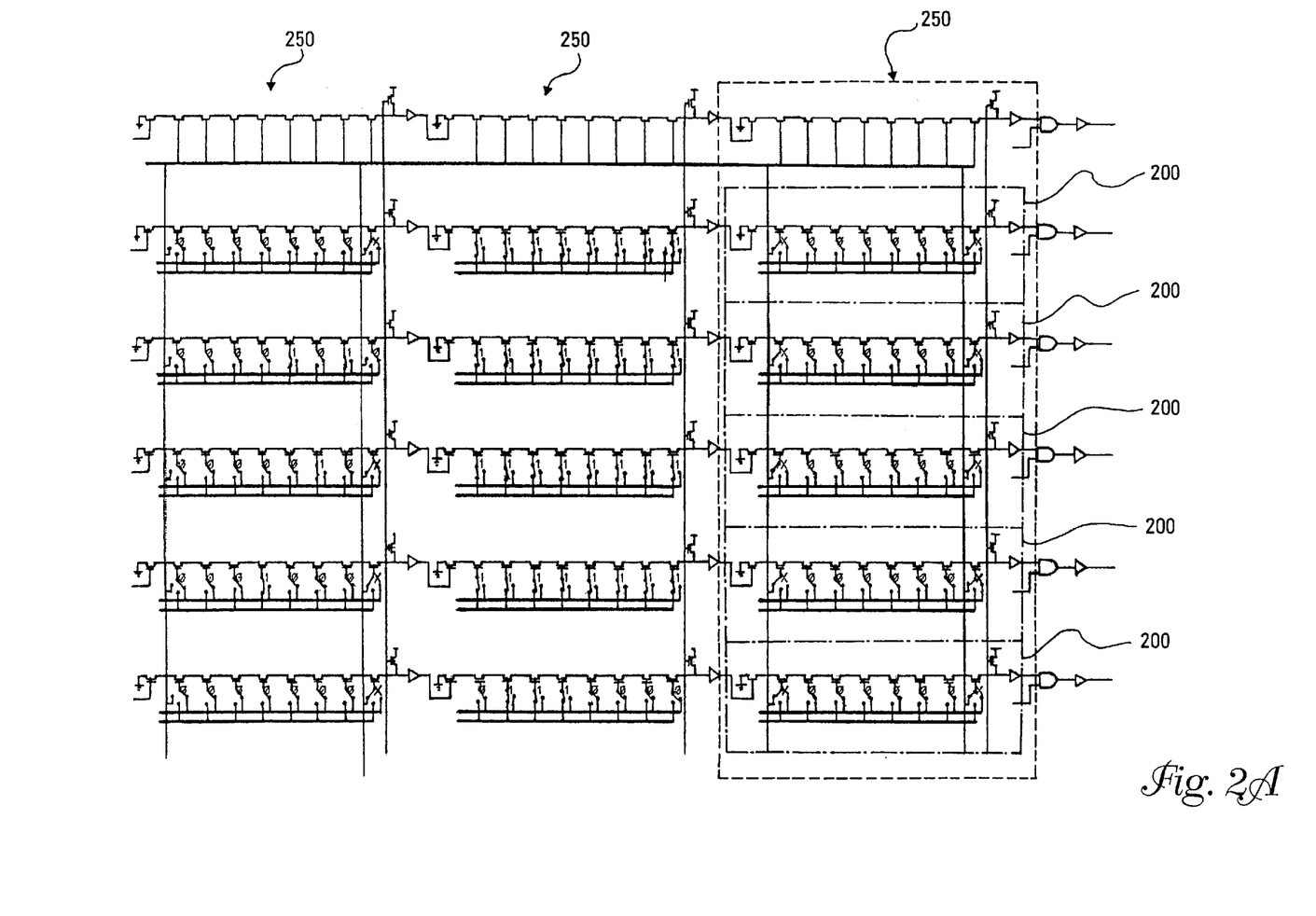
FIG. 2A is a circuit diagram of another embodiment of the present invention.

FIG. 2A shows a schematic with three encoders, a DQ section, a feedback section, and a status section. However, it should be understood that the decoder configuration is modular. More or fewer decoders are used in other embodiments without departing from the scope of the invention.

A plurality of blocks such as block 200 are used to decode multiple bytes of input data, status data, and the like, in various embodiments. A number of blocks such as block 200 are shown connected in a series of decoder sections 250 in FIG. 2A. Each of the decoder sections 250 is sized with a number of blocks 200 to accommodate the number of input signal combinations into the decoder. The number of decoder sections 250 is changed to accommodate the number of decoder sections necessary for the full decoder to be operable. Since the layout of each block 200 is the same, the embodiments of the present invention are scalable to whatever size decoder is required.

In operation, the CUI works as follows. During a pre-charge phase, all the decoder nodes are pulled up. During the decoding phase, when the ROM_READ signal is asserted, all the decoders are enabled via the extra transistor in series to the decoder transistors. In one embodiment, there are 24 transistors used to recognize the configuration of the DQ inputs, status, and feedback signals, eight for each set of signals. If the global input configuration for all of the transistors is matched by the DQ inputs, the status, and the feedback, then only one of the decoder output nodes is discharged, and a single wordline is asserted.

Figure 3:
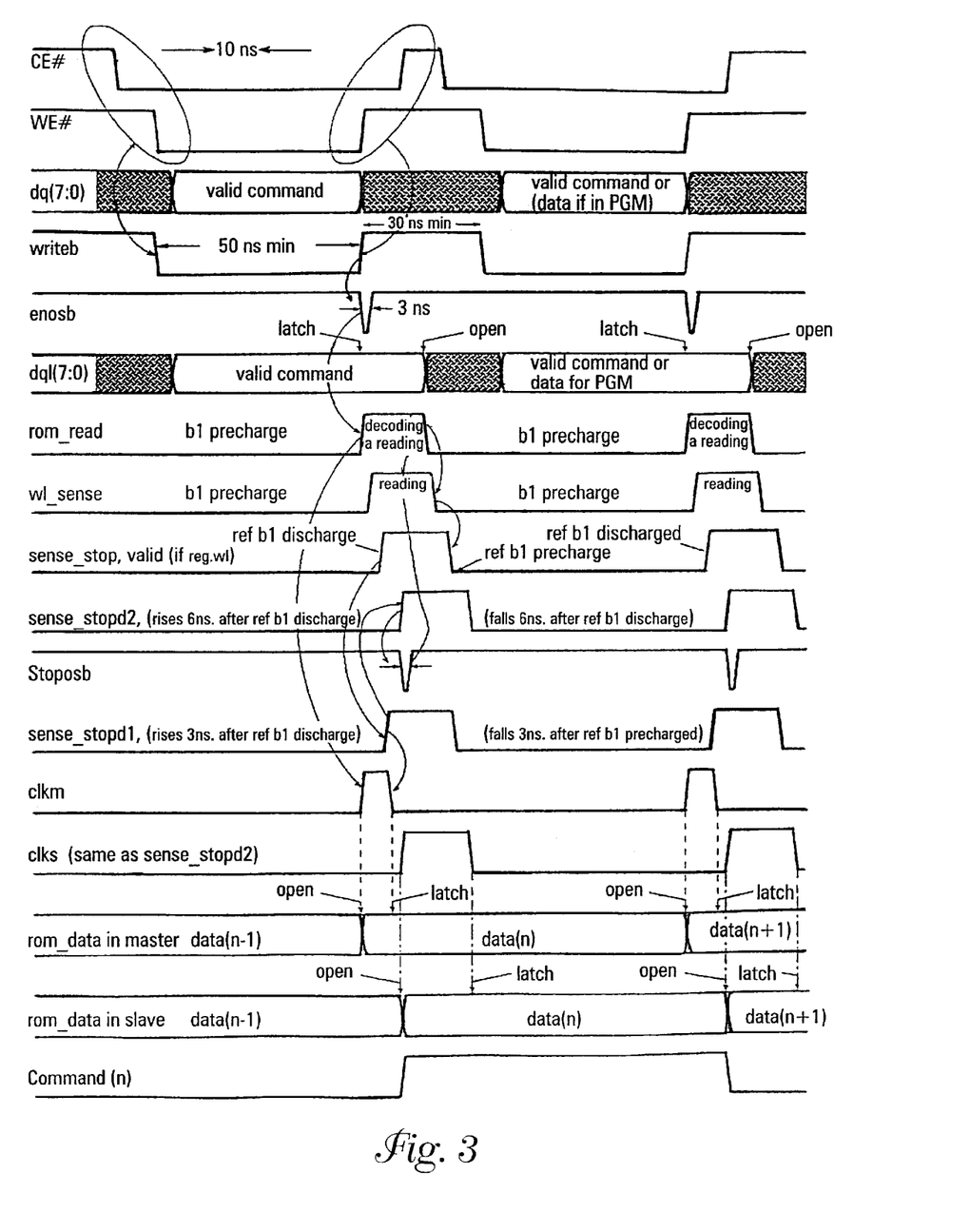
FIG. 3 is a timing diagram of a timing sequence of an embodiment of the present invention.

When the decoder asserts a ROM wordline, the ROM access begins. Standard control circuitry feeds sequential timing for the ROM. A timing diagram for operation of one embodiment of the CUI 100 is shown in FIG. 3 for a bitline pre-charge phase and a following sensing phase. When the addressed data are stored in the latches, the control circuitry switches the decoder and the ROM off to reduce power consumption. The signals output by the latches control the next state of the CUI and also give information to the WSM about the operation to be executed.

In another embodiment, the CUI and ROM are utilized in low power devices. Such devices include by way of example only and not by way of limitation cellular telephones, handheld computing devices, and the like. The assertion of the CE* and WE* signals, or a combination thereof, in one embodiment constitutes a circuit wakeup signal to begin operation. The cycle time for the input signals is in one embodiment approximately 80 nanoseconds. On the other hand, the approximate time for completion of all ROM operations, including decoding, ROM access, latching, and feedback, is approximately 40–50 nanoseconds. That leaves a significant portion of each cycle in which the ROM is normally powered, but during which time the ROM is not performing any operations.

In one embodiment of the CUI of the present invention, the last operation to complete triggers on its falling edge a shutdown sequence which turns off power to the ROM. This stop point or trigger is given internally by the ROM circuitry. The last falling edge triggers the shutdown. Shutdown in one embodiment occurs within approximately 5–6 nanoseconds. Power is therefore conserved in one embodiment for approximately 20–30 nanoseconds of the cycle time, resulting in significant power savings. The next decoding phase is awakened by a new clock signal.

In the embodiments shown, one block of transistors is used for each wordline of the ROM. The number of transistors depends on the number of inputs. If there are 16 inputs, 16 transistors are used. Due to signal loss in series of transistors, banks of 8 are used in one embodiment, but they can be cascaded together to accommodate more inputs. In this way, the embodiments of the present invention are easily scalable to large systems of 50 or more inputs.

The various embodiments of the present invention described above are capable of implementation in multiple different chips, for example flash memories, DRAMs, and the like. Further, anything that can be encoded is capable of use with the ROM. For example, any analog voltage, temperature, state of other circuitry, and the like, if encoded in binary form, can be decoded using the decoder embodiments of the present invention. Then, when decoding with the decoder, different reactions to the same input can be made depending upon the current conditions.

Figure 4:
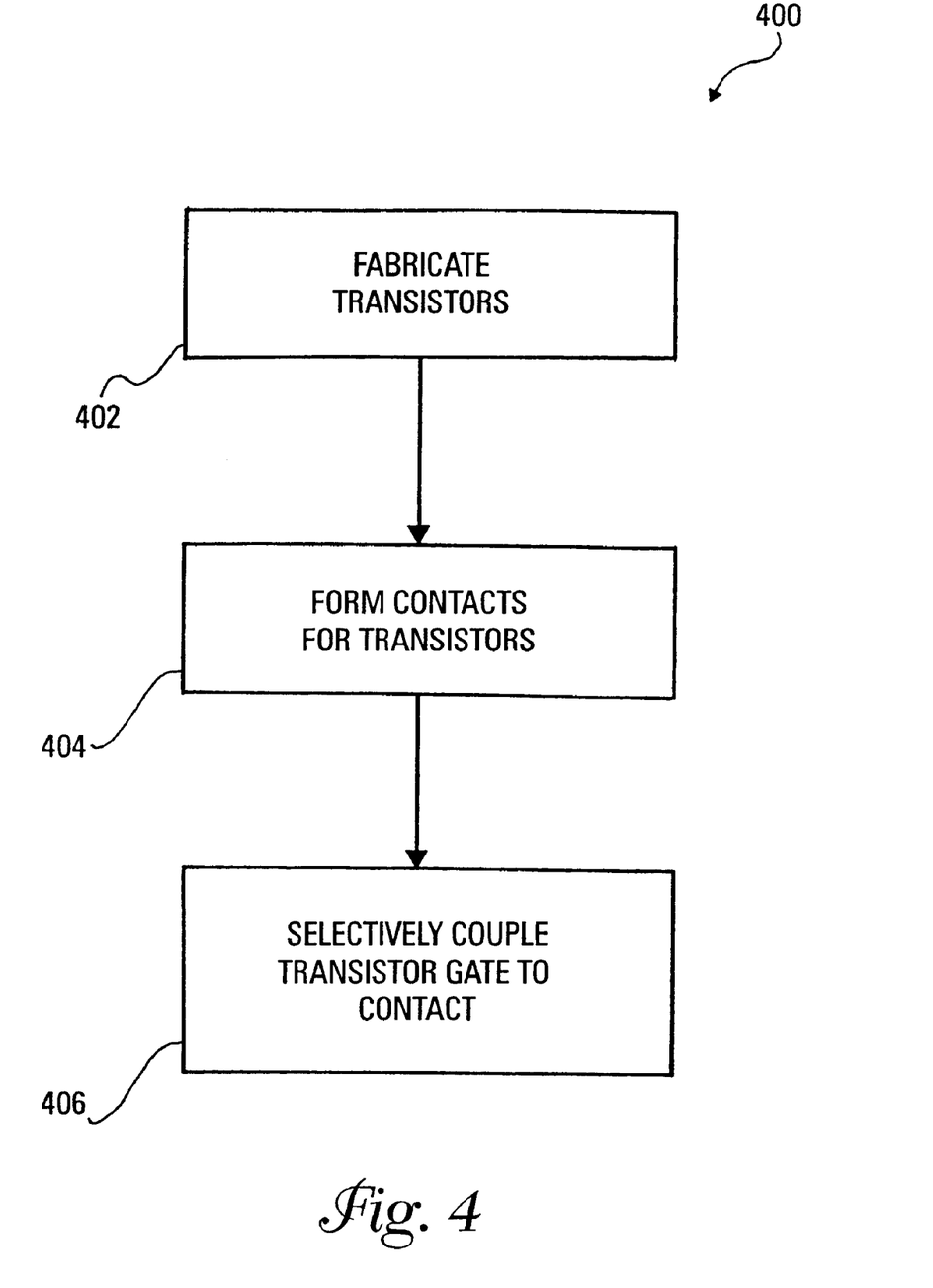
FIG. 4 is a flow chart diagram of a method according to another embodiment of the present invention.

A method 400 for programming a decoder is shown in greater detail in the flow chart diagram of FIG. 4. Method 400 comprises fabricating a plurality of transistors connected in series in block 402, and forming a plurality of contacts for each transistor to an input or to its complement in block 404. The transistors are in one embodiment selectively coupleable to one of the contacts. Process flow continues with selectively coupling the gate of each transistor to one of its pair of contacts in block 406. Coupling the gate of the transistor to a contact in one embodiment comprises making a via through an insulating layer in an appropriate position to access the appropriate contact, and interconnecting the via and the transistor gate. Since making vias is at or near the back end of the fabrication process, all that is necessary to be done following the making of the vias at the appropriate locations is to connect the two interconnects, that of the switch terminal and that of the gate of its transistor.

Changing a via mask to allow re-encoding of a decoder saves significant time and money, because the via mask is one of the last masks to be used in the process of fabricating an encoder. Further, since only the via mask needs to be changed, there is less waste of resources as well in the implementation of the various embodiments of the present invention.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A command user interface, comprising:
   a decoder having a plurality of series-connected transistors whose gates are selectively coupled to receive either an input or its complement using vias;
   a read only memory; and
   a plurality of latches to latch input and output data for the command user interface.

2. The command user interface of claim 1, wherein at least one of the series-connected transistors is further selectively coupled to receive a supply voltage using its via.

3. The command user interface of claim 1, wherein using the vias comprises selecting a location for the via.

4. The command user interface of claim 1, wherein each series-connected transistor has a first contact hard wired to the input and a second contact hard wired to the complement of the input.

5. The command user interface of claim 4, wherein at least one of the transistors has a third contact hard wired to a supply voltage.

6. The command user interface of claim 1, wherein the decoder comprises:
   a plurality of decoder blocks, each decoder block comprising a plurality of transistors connected in series, each transistor having a first contact coupled to the input, and a second contact coupled to the complement of the input.

7. The command user interface of claim 1, wherein each transistor is capable of one selective coupling to connect the gate of its transistor.

8. The command user interface of claim 2, wherein at least one of the plurality of transistors is further programmable to connect to the supply voltage to configure the transistor as a don't care.

9. The command user interface of claim 1, wherein the decoder comprises:
   a first decoder section comprising:
      a plurality of transistors connected in series; and
      a plurality of contacts, each contact coupled to either the input or the complement of the input, wherein the vias connect a gate of a single transistor of the plurality of transistors to either the input or to the complement of the input using the vias.

10. The command user interface of claim 9, wherein at least one of the plurality of transistors is further selectively coupled to receive a supply voltage using its via.

11. The command user interface of claim 9, wherein the decoder further comprises a second decoder section substantially identical to the first decoder section, and connected in series with the first decoder section, the first and the second decoder sections to decode different inputs to the decoder.

12. The command user interface of claim 9, wherein the decoder further comprises a second decoder section substantially identical to the first decoder section, and connected in parallel with the first decoder section, the first and the second decoder sections to decode different inputs to the decoder.

13. The command user interface of claim 1, wherein the plurality of latches comprises:
   a plurality of input latches to receive input data and a clock signal and to output latched input data to the decoder;
   a plurality of output latches to receive output data from the ROM; and
   a plurality of status latches to receive state information from the ROM and to output latched status data to the decoder.

14. The command user interface of claim 13, wherein the input latches further receive a feedback signal from an external write state machine and wherein the input latches output latched feedback data to external circuitry.

15. A command user interface, comprising:
   a plurality of transistors connected in series, each transistor having first and second contacts hard programmed to a low logic value and a high logic value respectively;
   a plurality of vias each connectable between a gate of one of the plurality of transistors and the first or the second contact to hard program the low logic value or the high logic value;
   a read only memory; and
   a plurality of latches to latch input and output data for the command user interface.

16. The command user interface of claim 15, wherein at least one of the plurality of transistors has a third contact hard programmed to a supply voltage.

17. The command user interface of claim 15, and further comprising:
- a second plurality of transistors connected in series, each of the second plurality of transistors having first and second contacts hard programmed to a low logic value and a high logic value respectively;
- a second plurality of vias each connectable between a gate of one of the second plurality of transistors and the first or the second contact to hard program the low logic value or the high logic value;
- a second read only memory; and
- a second plurality of latches to latch input and output data for the command user interface.

18. A command user interface, comprising:
- a plurality of decoders, each decoder having a series of transistors whose gates are selectively coupled to receive either an input or its complement using vias;
- a read only memory; and
- a plurality of latches to latch input and output data for the command user interface.

19. The command user interface of claim 18, wherein each decoder comprises:
- a plurality of transistors connected in series, each transistor having a first contact hard wired to the input and a second contact hard wired to the complement of the input.

20. The command user interface of claim 18, wherein each decoder further comprises a plurality of decoder section, each decoder section comprising:
- a plurality of transistors connected in series; and
- a plurality of contacts, each contact coupled to either the input or the complement of the input, wherein the vias connect a gate of a single transistor of the plurality of transistors to either the input or to the complement of the input using the vias.

* * * * *

UNITED STATES PATENT AND TRADEMARK OFFICE
CERTIFICATE OF CORRECTION

PATENT NO. : 6,757,872 B2
DATED : June 29, 2004
INVENTOR(S) : Pistilli et al.

It is certified that error appears in the above-identified patent and that said Letters Patent is hereby corrected as shown below:

<u>Title page,</u>
Item [30], Foreign Application Priority Data, replace "RM2001A0298" with
-- RM2001A000298 --.

Signed and Sealed this

Eighteenth Day of October, 2005

JON W. DUDAS
*Director of the United States Patent and Trademark Office*